United States Patent [19]
Larsen et al.

[11] Patent Number: 5,911,584
[45] Date of Patent: Jun. 15, 1999

[54] CIRCUIT CARD CONNECTOR WITH ISOLATION BASE ASSEMBLY

[75] Inventors: Russell G. Larsen, San Jose; John E. Lopata, Redwood City; Gregory David Spanier, Cupertino, all of Calif.; Henry Zielke, Hoffman Estates, Ill.

[73] Assignee: Molex Incorporated, Lisle, Ill.

[21] Appl. No.: 08/915,433

[22] Filed: Aug. 20, 1997

[51] Int. Cl.⁶ .................................................. H01R 9/09
[52] U.S. Cl. ............................................ 439/67; 439/632
[58] Field of Search ............................ 439/62, 67, 493, 439/632

[56] References Cited

U.S. PATENT DOCUMENTS

| | | | |
|---|---|---|---|
| 5,308,249 | 5/1994 | Renn et al. | 439/62 |
| 5,316,486 | 5/1994 | Tanaka et al. | 439/62 |
| 5,505,625 | 4/1996 | Byer et al. | 439/62 |
| 5,564,931 | 10/1996 | Fabian et al. | 439/62 |
| 5,679,018 | 10/1997 | Lopata et al. | 439/260 |

*Primary Examiner*—Neil Abrams
*Assistant Examiner*—Barry M. L. Standig
*Attorney, Agent, or Firm*—A. A. Tirva

[57] ABSTRACT

A circuit card connector that utilizes flexible circuitry includes one or more isolator portions attached to its base that serve to substantially isolate the base of the connector from the circuit board to which the connector is mounted. The isolator portions include feet that extend out from the connector and which partially support the flexible circuitry. These isolator portions are made from thermally insulative material and serve to prevent heat transfer to the connector base from occurring during soldering of the flexible circuitry conductive portions to the circuit board.

27 Claims, 4 Drawing Sheets

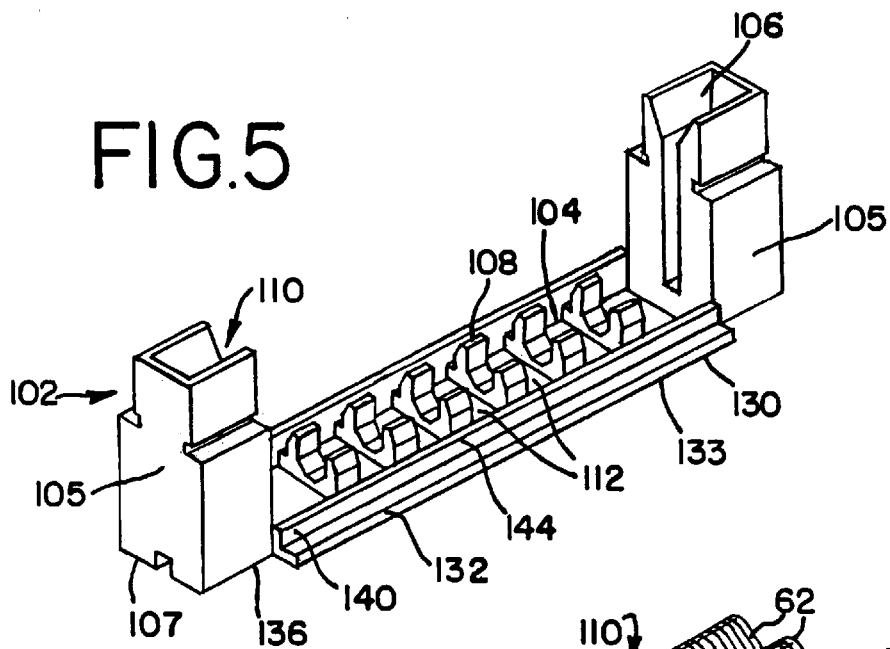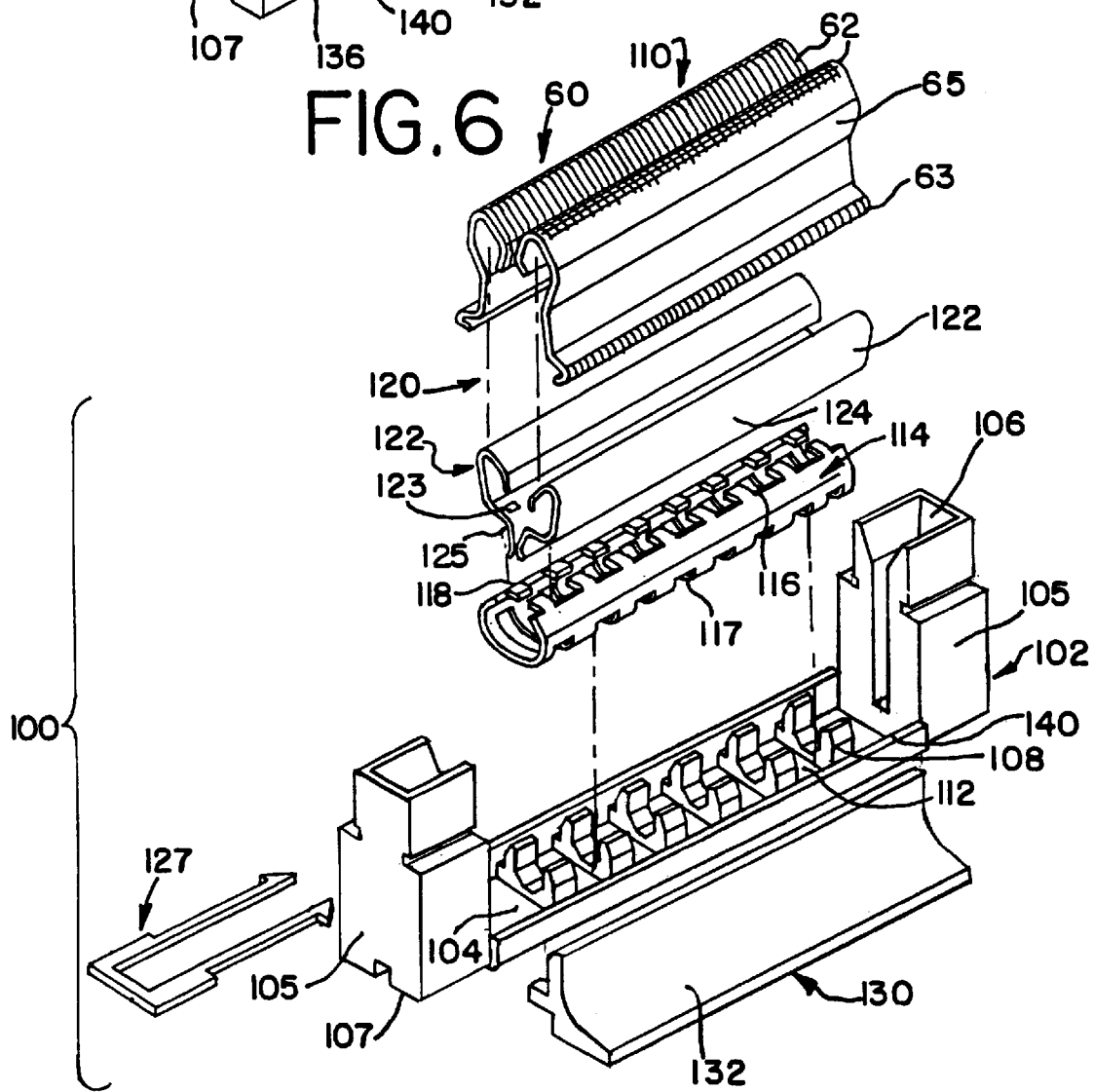

CIRCUIT CARD CONNECTOR WITH ISOLATION BASE ASSEMBLY

BACKGROUND OF THE INVENTION

The present invention relates generally to edge card connectors, and more particularly to connectors that utilize flexible circuitry as the connector contacts and which have an improved card engagement means.

Connectors are well known in the art which provide a connection between a primary circuit board and a secondary circuit board and are commonly referred to in the art as edge card connectors. These connectors typically include an insulative housing having a slot extending lengthwise within the housing that receives an edge of the secondary circuit card and a plurality of contacts on opposing sides of the slot. These contacts are typically stamped and formed and thus such connectors are limited in their "pitch", i.e., the spacing between the contacts. Where the connector contacts are stamped and formed, the stamping and forming process limits the pitch that can be obtained to about 0.5 mm.

By using flexible circuitry for the contacts, smaller pitches of about 0.3 mm may be obtained. Flexible circuitry has been incorporated in some edge card connectors, such as those shown in U.S. Pat. No. 3,614,707 issued Oct. 19, 1971 and U.S. Pat. No. 5,427,533 issued Jan. 27, 1995. These two connectors have flexible circuitry extending over their connector slots so that a circuit card may be inserted into and withdrawn from the connector slot as needed.

Applicant's copending patent application, Ser. No. 08/635,049 now U.S. Pat. No. 5,679,018, filed Apr. 17, 1996 for "Circuit Card Connector Utilizing Flexible Film Circuitry" describes a card connector utilizing flexible circuitry and having a reliable circuit card-engaging means that applies and maintains a reliable contact force on the conductive traces that are formed on the circuit card. Although reliable, it has been discovered that this connector construction has some disadvantages. The base member of the housing is typically die-cast and includes feet that extend laterally outwardly from the connector. The flexible circuitry conductive portions that are soldered to conductive traces on the circuit board extend around and under these feet. The conductive portions of the flexible circuitry are typically soldered to the traces on the circuit board, while the connector feet press the flexible circuitry conductive portions against the circuit board traces.

In these type of connectors, it has been found that forces generated by the insertion and withdrawal of the circuit card from the connector may be transmitted from the base member through the feet directly to the soldered connections between the flexible circuitry and the conductive traces on the circuit board. Failure of some of the soldered connections may result from this force transfer. It may also be difficult to control the coplanarity of the conductive portions of the flexible circuitry because of the die-cast process. The occasional variability of printed circuit boards to which the connector is mounted also may create coplanarity problems. Still further, the die-cast metal composition of the base member feet may unintentionally transfer substantial amount of heat away from the flexible circuitry conductive portions during soldering which may result in bad solder joints and affect the electrical integrity of the signals passing therethrough.

Accordingly, a need for a flexible circuitry connector having an isolation member as part of its base exists.

Such a connector is not present or suggested by the prior art. U.S. Pat. No. 5,564,931, issued Oct. 15, 1996 describes an edge card connector using flexible circuitry that has a solid base member that has a plurality of feet integrally formed therewith. U.S. Pat. No. 5,308,249, issued May 3, 1994 describes an edge card connector using flexible circuitry that relies upon a pair of L-shaped members that serve as the feet and contacts of the connector. Neither of these prior art connectors offers a solution to the aforementioned disadvantages.

SUMMARY OF THE INVENTION

The present invention overcomes these disadvantages by providing an isolated connector base assembly having isolator members that are attached to the base of the connector that separate the connector base from the circuit board. These isolators are preferably formed from a plastic material and include feet that extend laterally outwardly from the base. The two-part construction serves to structurally isolate the solder connections of the flexible circuitry to the circuit board from the base of the connector in a manner which minimizes the effect of insertion and withdrawal forces. The resiliency of the isolator members also allows better conformance of the connector to surface variations in circuit board.

In one principal aspect of the present invention and as exemplified by the preferred embodiment of the invention, an improved circuit card connector is provided with a card-engaging assembly that defines a circuit card-receiving slot which extends lengthwise of the connector. This card-engaging assembly includes spring members that support opposing lengths of flexible film circuitry on opposite sides of the card-receiving slot. The spring members move inwardly toward the card-receiving slot circuit card when the circuit card is inserted to apply a contact force between the flexible circuitry and the circuit card contacts.

In another principal aspect of the present invention, a cradle spring may be provided to support a pair of contact springs as the spring members. The cradle spring defines the lower extent of a circuit card-receiving slot of the connector and is supported on a connector base. The connector base supports the cradle spring and includes one or more isolator portions that run lengthwise along the base and partly serve as feet for the connector, with the flexible circuitry being interposed between the feet and the circuit board. These isolator portions have feet that project outwardly from the base. The flexible circuitry for the connector extends over and around edges of the isolator portions so that the isolator portions serve to maintain the conductive portions of the flexible circuitry in alignment with their opposing conductive forces of the circuit board.

In still another principal aspect of the present invention, the isolator portions are formed from a non-metallic material that is a different material than that of the base in order to better conform to circuit board surface variations. These separate materials effectively isolate any detrimental forces generated during insertion and withdrawal of the circuit card in the base member itself not in the isolator portion feet, thereby effectively isolating the solder connections underneath the isolator portions from the connector from such detrimental forces.

In yet a further principal aspect of the present invention, the isolator portions serve as compliant braces to the connector base to assist it in matching the surface profile of the circuit board in order to more effectively achieve coplanarity of the flexible circuitry conductive traces with the circuit traces on the circuit board. The isolator portions also serve as a thermally insulative material in order to minimize heat transfer to the connector base during soldering.

In a still further principal aspect, the isolator portions of the present invention include exterior attachment surfaces to which the flexible circuitry is attached, preferably by way of an adhesive attachment.

These and other objects, features and advantages of the present invention will be clearly understood through a consideration of the following detailed description.

BRIEF DESCRIPTION OF THE DRAWINGS

In the course of the following description of the detailed description, reference will be made to the attached drawings wherein like reference numerals identify like parts and wherein:

FIG. 5 is a perspective view of a connector base assembly constructed in accordance with the principles of the present invention;

FIG. 6 is a partially exploded perspective view of a circuit card connector and base assembly of FIG. 5;

DETAILED DESCRIPTION OF THE PREFERRED EMBODIMENTS

Figure 1:
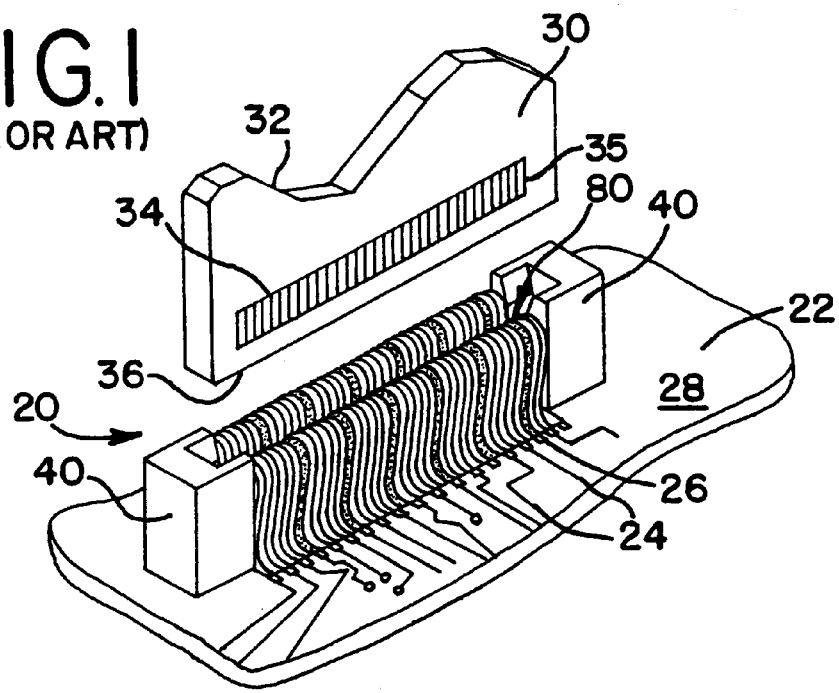
FIG. 1 is a perspective view of a prior art circuit card connector and circuit card that exemplifies the field of use and the type of connectors in which the present invention finds it greatest utility.

FIG. 1 illustrates a prior art card connector, generally indicated at 20, constructed in accordance with the principles of the present invention. This connector and its constructions are described in U.S. patent application Ser. No. 08/635,049 now U.S. Pat. No. 5,679,018, filed Apr. 17, 1996 for "Circuit Card Connector Utilizing Flexible Film Circuitry" and which is assigned to the assignee of the present invention. The disclosure of this patent application is incorporated by reference herein.

Turning to FIG. 1, a known connector 20 is depicted and illustrates the type and style of circuit card connectors to which the present invention is directed. The connector 20 is mounted to a primary printed circuit board 22 having a plurality of different circuits 24 disposed thereon leading to a plurality of associated contact pads, or traces 26, located on a mounting surface 28 of the circuit board 22.

The connector 20 is intended to provide a connection between the circuit board 22 and a secondary circuit card 30 having a generally planar substrate 32 and a plurality of contact pads 34 aligned with an insertion edge 36 of the circuit card 30. The circuit card 30 has its contact pads 34 disposed on both sides thereof, typically arranged in an array of one or more distinct rows 35 proximate to the insertion edge 36. These contact pads 34 may, if desired, be electrically connected in ways well known in the art to provide redundant contact surfaces in order to enhance the reliability of the circuit card-connector connection.

Figure 2:
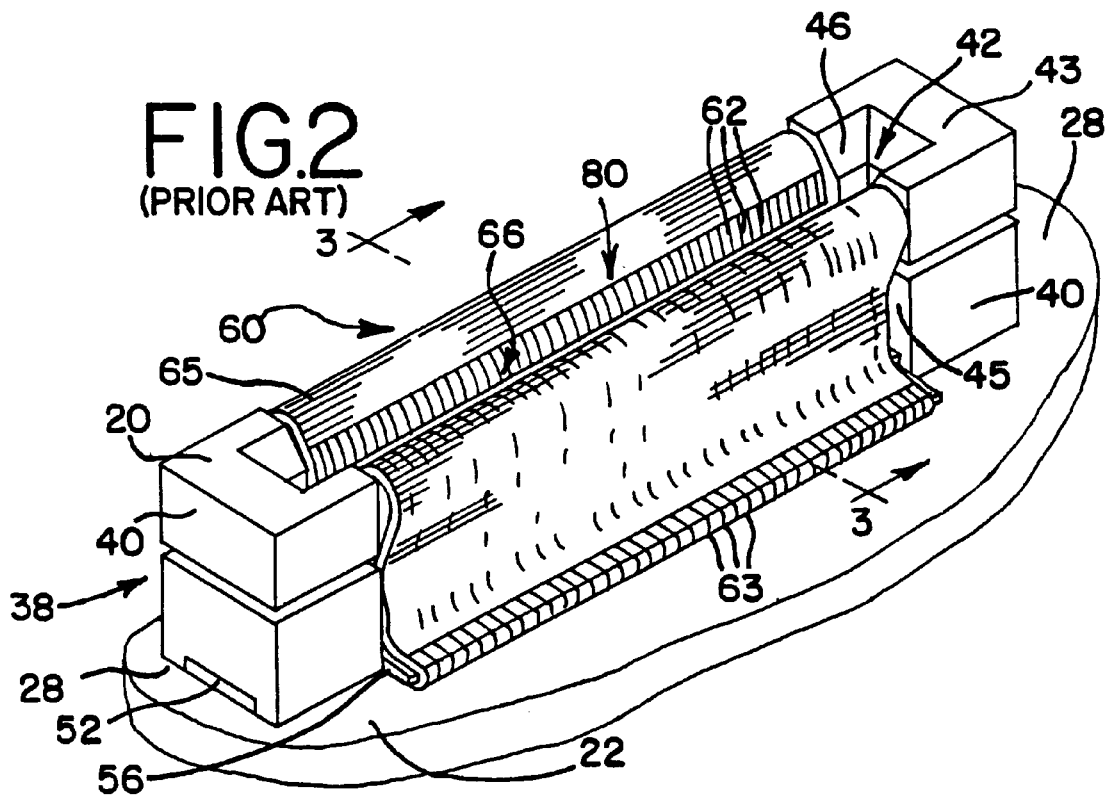
FIG. 2 is an enlarged perspective view of the connector of FIG. 1.

Turning now to FIG. 2, it can be seen that the connector 20 has a housing, or body 38, that extends lengthwise and which generally includes two opposing end portions 40, preferably which are formed from an electrically insulative material, such as plastic. These end portions 40, serve to define the overall length of the connector 20 and its housing, as well as the longitudinal extent of a circuit card-receiving slot 80 of the connector 20. In this regard, the end portions 40, each include a recess 42 formed therein, which extends down from the upper surfaces 43 thereof to a predetermined depth D. (FIG. 3.)

These recesses 42 communicate with the interior, opposing faces 45 of the end portions 40 and may include in proximity to the upper surface 43, ramped portions 46, that provide lead-in surfaces into the recesses 42 to facilitate entry of the circuit card 30 into the connector card-receiving slot 80. Although the housing shown is defined by the two spaced-apart end portions 40 and the connector base 54 as illustrated in FIG. 4, it will be understood that the term "connector housing" as used herein is to be given its broadest interpretation and, as such, is intended to include connector structures that have longitudinal sidewalls which extend the entire length of the connector 20.

Figures 3, 4:
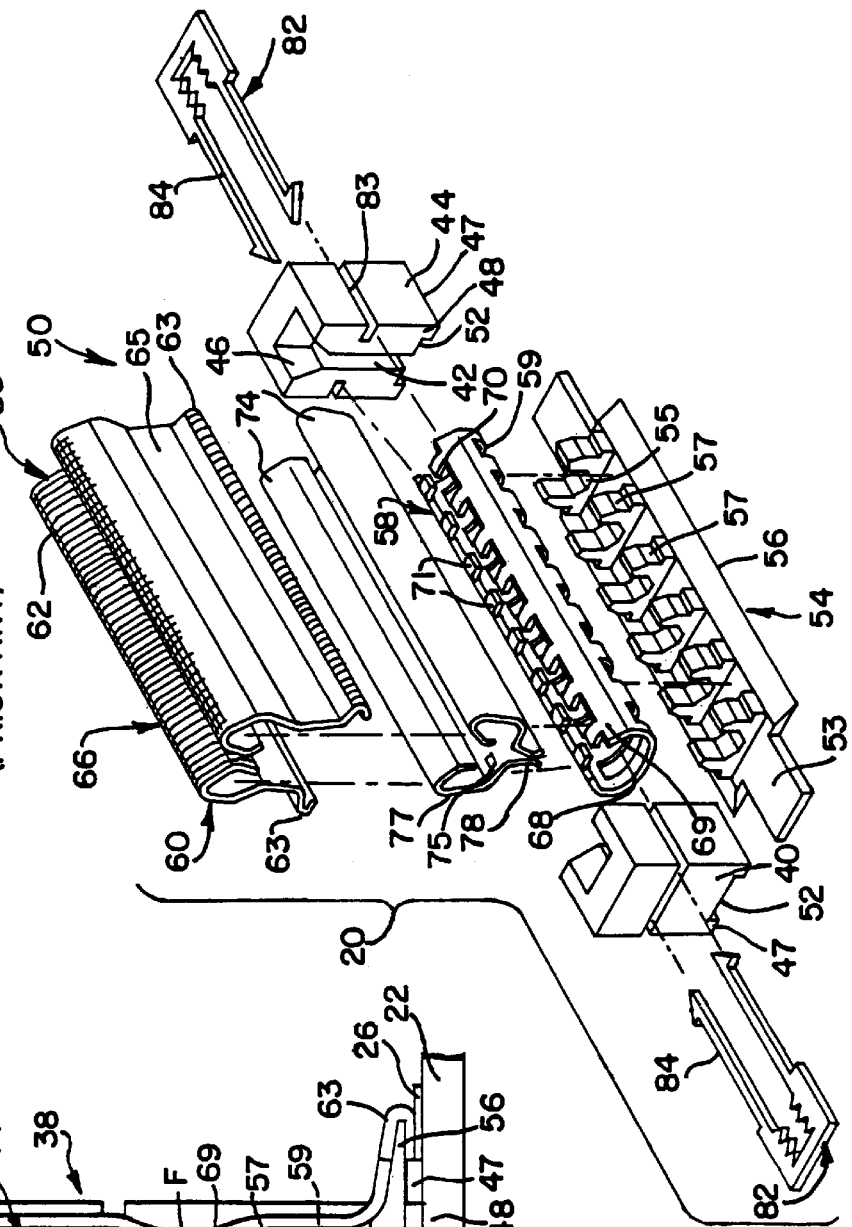
FIG. 3 is a sectional view of the connector of FIG. 2 taken along lines 3—3 thereof.
FIG. 4 is an exploded perspective view of the connector of FIG. 2.

The lower surfaces 47 of the end portions 40 are adapted to sit on the circuit board surface 28 and may be provided, as illustrated in FIG. 3, with support portions 48 and mounting lugs or posts 49. The connector end portions 40 are preferably aligned lengthwise along a longitudinal axis of the connector 20 so that their respective recesses 42 confront each other and preferably so that they are maintained in registration with respect to a centerline C (FIG. 3) of the card-receiving slot 80 of the connector 20.

The connector end portions 40 not only define opposing ends of the connector circuit card-receiving slot 80 by way of their respective recesses 42, but they also support a circuit card-engagement assembly 50 therebetween. The components which make up this circuit card-engagement assembly 50 are best illustrated in FIG. 4. The connector circuit card-engagement assembly 50 includes an extent of flexible circuitry 60, that has a plurality of conductive traces, or contacts 66, formed thereon. These traces, as known in the art, are arranged in side-by-side order on flexible circuitry 60 and have first conductive portions 62 exposed in areas flanking the card-receiving slot 80 and second conductive portions 63 exposed at opposite ends thereof that oppose the mounting surface 28 of the circuit board 22. Such flexible circuitry 60 typically has a laminated construction utilizing flexible electrical contacts, or traces 66, formed from conductive metal foils and bonded to a flexible, electrically insulative layer such as a polyamide film. An outer insulative layer 65 may be utilized that overlies the contacts 66.

The connector end portions 40 may also include hollow cavities 52 formed in their lower surfaces that receive opposing end tabs 53 of a connector base member 54. The connector base member 54 extends lengthwise between the connector end portions 40 and has a width slightly greater than the end portions 40 in order to provide support for the flexible circuitry 60 of the connector 20. The base member 54 further has a flat central portion 55 (FIG. 3) which may be considered as defining the lowermost extent of the card-receiving slot 80.

The connector base 54 may further include foot portions 56 that extend outwardly and which support the flexible circuitry 60 near the second conductive portions 63 thereof. A plurality of posts 57 extend upwardly from the base member 54. These posts 57 are spaced apart from each other both lengthwise and laterally within the connector 20 and further flank the base member central portions 55 to provide a preload, or biasing force to a cradle spring 58 of the card-engagement assembly 50 as explained in greater detail in said application Ser. No. 08/635,049 now U.S. Pat. No. 5,679,018. Additionally, the posts 57 of the connector base member 54 hold the cradle spring 58 in position to maintain a predetermined separation between the free ends of the cradle spring regardless of the tolerances to which the cradle spring may be made.

The cradle spring 58 extends lengthwise between the connector end portions 40 and includes a plurality of transverse slots 59 which are spaced apart from each other in the longitudinal direction (FIG. 4). These slots 59 are dimensioned to receive the posts 57 of the base member 54. As seen in FIG. 4, the cradle spring 58 has a base portion 68 and two sidewalls 69 extending upwardly therefrom which terminate in free ends 70. The free ends 70 define in part fulcrums F (FIG. 3) for the card-engaging assembly 50. These fulcrums F lie on opposite sides of the centerline C of the connector 20 and of the card-receiving slot 80 and support a pair of contact springs 74. The free ends 70 of the cradle spring 58 preferably further include a series of engagement lugs 71 which serve to retain the contact springs 74 in place along the fulcrums F. These lugs 71 extend laterally inwardly from the cradle spring sidewalls 69 so that they engage the contact springs 74.

The posts 57 of the connector base member 54 preferably have a configuration as shown which will apply a predetermined or outwardly-directed biasing force against the cradle spring 58. A pair of contact springs 74 extend lengthwise along the cradle spring 58 and include spaced-apart openings 75 that extend lengthwise along the cradle spring 58 in the same spacing as the cradle spring engagement lugs 71 so that when assembled, the contact springs 74 rest on the fulcrums F of the cradle spring and the engagement lugs 71 extend through the contact springs openings 75. The contact springs 74 may be considered as having in end profile, a general S-type shape, with distinct spring arms 77 and spring legs 78 located on opposite sides of the fulcrums F. The spring arm and legs 77, 78 can be seen to extend lengthwise along the connector 20 at different levels within the card-receiving slot 80.

The contact springs 74 serve as support surfaces for the flexible circuitry 60 which is applied to the outer surfaces of the contact spring arms 77. The flexible circuitry 60 extends down toward the connector base member 54 where the second conductive portions are aligned with and soldered to the contact pads 26 on the circuit board mounting surface 28. As illustrated in FIG. 4, a pair of retention clips 82 may be received within outer slots 83 of the connector end portions 40. These clips 82 are generally C-shaped and include a pair of arms 84 that extend longitudinally therefrom and engage the contact springs 74.

As mentioned above, it has been discovered in using the prior art connector 20 that during insertion and withdrawal of the circuit card 30 into the card-engagement assembly 50, forces are generated which may detrimentally affect the solder joints formed between the circuit board contact pads 26 and the flexible circuitry second conductive portions 63. Additionally, it has been noted that in the known connector 20, when the connector base 54 of the connector housing is formed from metal, the metal foot portions 56 thereof will exhibit a tendency to transfer heat from the flexible circuitry second conductive portions 63 to the connector base 54. This may often lead to bad or weakened solder joints joining the connector 20 to the circuit board 22. The present invention overcomes these disadvantages.

Figure 9:
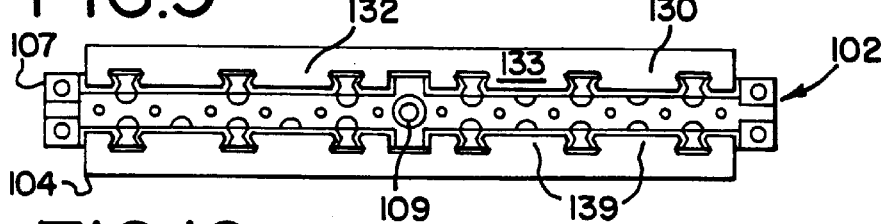
FIG. 9 is a plan view of the bottom of the connector of FIG. 6 illustrating the isolator braces in place thereon.
Figure 10:
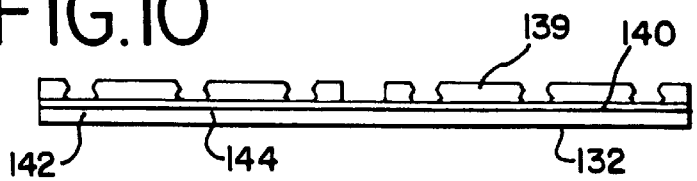
FIG. 10 is top plan view of one of the isolator braces of the present invention; and, FIG. 11 is a perspective view of the isolator brace of FIG. 10.

Turning now to FIG. 6, a circuit card connector 100 constructed in accordance with the principles of the present invention. The connector 100 includes a connector housing, or body 102, that is die-cast from a metal, such as aluminum. The housing 102 has a base portion 104 that extends lengthwise between two end portions 105. The housing end portions 105 serve to define the ends of the connector 100 and each include two vertical channels 106 that cooperate with a circuit card engagement assembly 120 to define a connector slot 110 of the connector 100. The housing end portions 105 may include stand off portions 107 that contact the mounting surface 28 of the circuit board 22. (FIG. 7) The housing 102 may also include one or more mounting posts 109 that are received within holes on the circuit board 22 to position the connector 100. (FIG. 9.)

The connector base portion 104, in the embodiment shown, interconnects the housing end portions 105. In this regard, the connector base 104 and the end portions 105 may be integrally molded together as one piece, or they may be separately formed and assembled subsequent to forming. The base 104 has a series of upwardly extending posts 108 that are spaced apart from each other along the length of the base portion 104. The posts 108 are arranged in pairs as shown, with an intervening slot 112 being disposed in between each such pair. The base slots 112 form what may be considered as the bottommost extent of the card-receiving slot 110 of the connector 100. The posts 105 support a cradle spring 114 in the connector housing 102.

The cradle spring 114 has a U-shape when viewed from the end and has two shoulder portions 116 that extend the length of the spring 114. The cradle spring 114 preferably includes a series of openings 117 that engage the base posts 108. The shoulders 116 and a series of retention lugs 118 support two S-shaped contact springs 122 on opposite sides of the centerline of the card-receiving slot 110. As mentioned above with respect to the connector 20, the contact springs 122 through openings 123 (FIG. 6) rest on the shoulders 116 of the cradle spring 114 and are capable of pivoting around a fulcrum F that extends along the cradle spring shoulders 116. The contact springs 122 have distinct upper and lower engagement portions in the form of arms and legs 124, 125 that engage the surfaces of the circuit card when inserted into the card-receiving slot 110. Retention clips 127 may be provided to retain the contact springs 122 in a proper orientation in place within the connector housing 102.

In operation (and with reference to FIG. 7), when a circuit card is inserted into the connector card-receiving slot 110, the circuit card contact pads 34 will engage the spring legs 125 and spread them outwardly, thereby causing the spring arms 124 to contact the circuit card contact pads 34. When the circuit card 30 is inserted and removed from the card-receiving slot 110, forces may be generated in the connector housing 102, and particularly the connector base 104. These forces may be transferred to the lower ends of the flexible circuitry 60 and the second conductive portions 63 thereof.

Figure 7:
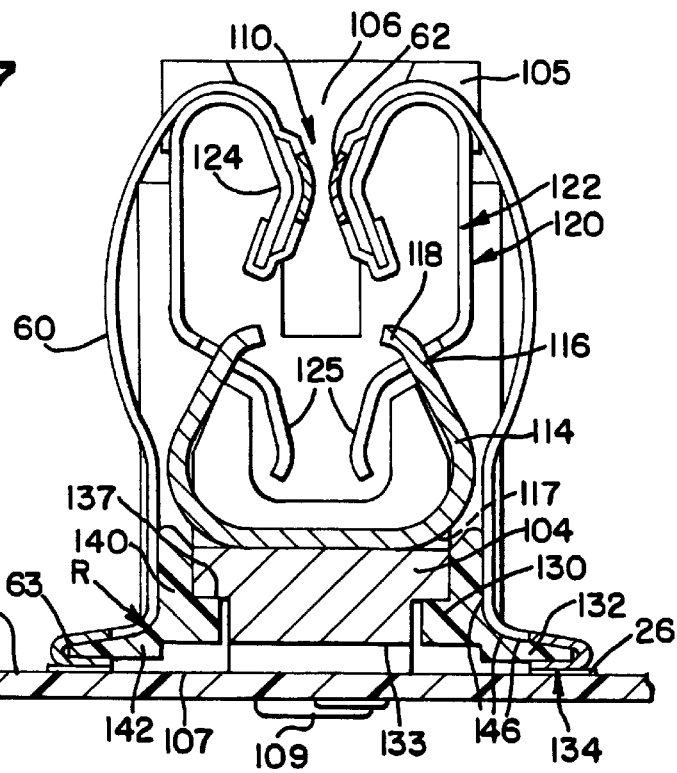
FIG. 7 is a cross-sectional view of the connector of FIG. 6 assembled together.
Figure 8:
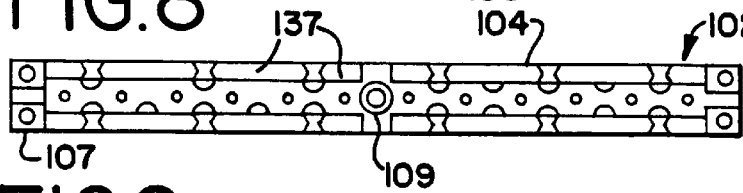
FIG. 8 is a plan view taken from the bottom of the connector base of the connector of FIG. 5.
Figure 11:
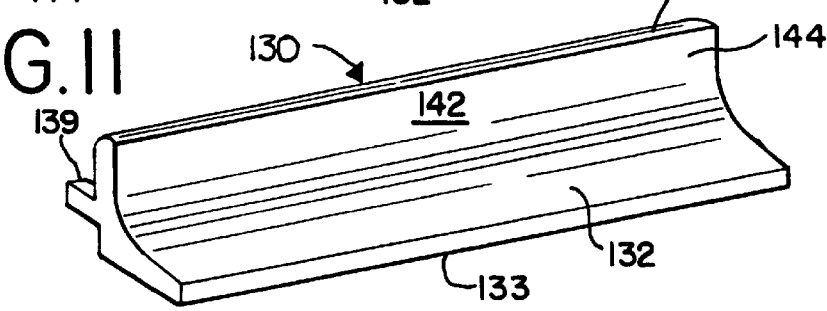

In order to avoid the transfer of these insertion and withdrawal forces, the present invention utilizes a means for isolating the connector base 104 from the flexible circuitry 60. As best seen in FIG. 7, this isolation means includes a pair of elongated braces 130 (FIG. 11) that extend lengthwise along the connector base 104 between the end portions 105 of the connector housing 102. The isolator braces 130 have a length substantially equal to that of the connector base 104 and desirably extend for at least the length of the flexible circuitry 60 and preferably extend slightly past the ends of the flexible circuitry 60. The isolator braces 130 include outwardly extending foot portions 132 (FIGS. 7 & 11) that engage the lower ends of the flexible circuitry 60 near the second conductive portions 63 thereof. The flexible circuitry 60 is attached to the braces 130 and the braces 130 have a lower flat surface 133 that maintains the flexible circuitry second conductive portions 63 is a plane, and importantly a plane that is substantially parallel to the plane of the mounting surface 128 and the contact pads 26 of the circuit board 22.

In another important aspect of the present invention, the isolator braces 130 are preferably formed from a thermally insulative material, such as a plastic. This insulative material is different than the material from which the connector base 104 is made, such as a die-cast metal. The difference in material is beneficial from two aspects. One, the thermally insulative nature of the material permits the isolator braces 130 to act as a heat insulator of the connector 100 during soldering of the flexible circuitry 60 to the circuit board contact pads 26. This minimizes heat transfer from the soldering area, namely, the circuit board contact pads 26 and flexible circuitry second conductive portions 63, to the metal connector base 104, thereby promoting better soldering of the connector 100 to the circuit board 26.

Additionally, the use of a different material, preferably a plastic with greater resiliency characteristics than the metal of the connector base 104, permits the braces 130 to better conform to variations that may occur in the circuit board 22. The material used for the braces 130 also preferably has greater flexibility than the metal from which the known connector 20 was previously made which assists the braces 130 in maintaining coplanarity of the second conductive portions 63 of the flexible circuitry 60. Still further, the difference in materials enhances the interface that occurs between the connector base 104 and the isolator braces 130 which effectively isolates the solder joints 134 from the base 104. With this isolator, loads transmitted to the base 104 during insertion or withdrawal of the circuit card 30 will not fully be transmitted to the solder joints 134, thereby promoting longevity of the solder joints 134 once the connector 100 is mounted to the circuit board 22.

In order to effectuate the assembly of the connector 100, the bottom surface 136 of the connector base 136 is specially configured with a plurality of recesses 137 spaced apart along its length and supported by dividers 138 formed in the connector base bottom surface 133. These recesses 137 receive corresponding engagement tabs 139 defined on the braces 130. These engagement tabs 139 are preferably slightly smaller than the recesses. The engagement tabs 139 also serve to align the braces 130 and the flexible circuitry 60 attached thereto with respect to the connector 100. In assembly, the braces 130 may be attached to the connector base 104 by heat-staking, where heat is applied to the braces engagement tabs 139 to the point where they expand and fill the connector base recesses 137.

The braces 130 also may include a vertical rib 140 that extends along the length of the brace 130. These ribs 140 and the foot portions 132 cooperatively present an L-shaped profile to the braces 130 when viewed from the ends, as in FIG. 7. The exterior surface 142 where the brace feet 132 join the ribs 140 may be formed with a predefined radius R. The vertical portion 144 of this exterior surface 142 forms an attachment zone 146 to which the flexible circuitry 60 is attached, preferably adhesively. (FIG. 7.) The vertical portion 144 of the brace 130 acts as an attachment shoulder having a relatively large adhesive area for attachment of the flexible circuitry 60. Attachment of the flexible circuitry 60 along this area 144 also relieves strain on the solder joints.

In assembly of the connectors 100 of the invention, the flexible circuitry 60 and any compliant material which may underlie it on the contact springs 122 are attached to the contact spring 122. The flexible circuitry 60, especially the area near the second conductive portions 63 thereof are also attached to the braces 130 to form a subassembly which is then cured to let its adhesive set, when an adhesive is used to attach the flexible circuitry 60 to the isolator braces 130. The subassembly may then be attached to the cradle spring 114 by engaging the lugs 118 thereof with the contact spring openings 123 (FIG. 6), and the cradle spring and subassembly placed on the connector base 104 and the braces 130, by way of their engagement tabs 139, are inserted into the base recesses 137 and then preferably heat-staked thereto to form a finished connector 100.

It will be understood that the braces 130 of the present invention effectively act as a structural and thermally insulative isolation layer that reduce the detrimental transfer of heat away from the solder joints 134 during assembly as well as reduce the transfer of insertion and withdrawal forces to the solder joints.

Accordingly, it will be appreciated that the embodiment of the present invention which has been discussed herein is merely illustrative of a few applications of the principles of the invention. Numerous modifications may be made by those skilled in the art without departing from the true spirit and scope of the invention.

We claim:

1. An electrical connector effecting a connection between a plurality of first circuits on a circuit board and a plurality of second circuits on a circuit card, comprising: a connector body having two opposing end portions and a base extending lengthwise between the body end portions, the connector body having a slot for receiving the circuit card therein, flexible circuitry supported by said connector body and disposed on opposite sides of the card-receiving slot, the flexible circuitry having first conductive portions disposed thereon within said card-receiving slot and second conductive portions disposed thereon and extending proximate to the connector base, and a brace disposed on said connector base for separating said flexible circuitry second conductive portions from said connector base, said brace being interposed between said flexible circuitry second conductive portions and said connector base.

2. The connector as claimed in claim 1, wherein said brace has a length substantially equal to a length of said connector base.

3. The connector as claimed in claim 1, wherein said connector base is die-cast from a metal and said brace is formed from a thermally insulative non-metallic material.

4. The connector as claimed in claim 1, wherein said connector base has a plurality of recesses formed therein and said brace includes a plurality of engagement tabs that are received within said recesses.

5. The connector as claimed in claim 4, wherein said brace is formed from a plastic material and said brace is heat staked to said connector base.

6. The connector as claimed in claim 1, wherein said brace includes a pair of isolator portions that are disposed on said connector base, the isolator portions having respective foot portions that extend away from said connector body, and said isolator portions being disposed proximate to said flexible circuitry second conductive portions.

7. The connector as claimed in claim 6, wherein said isolator portions are formed from a plastic material and include exterior attachment surfaces disposed proximate to said connector base and spaced from said flexible circuits second conductive surfaces, said flexible circuitry being attached to said isolator portion attachment surfaces.

8. The connector as claimed in claim 7, wherein said flexible circuitry is adhesively attached to said isolator portion exterior attachment surfaces.

9. The connector as claimed in claim 6, wherein said isolator portions have a general L-shaped profile.

10. The connector as claimed in claim 6, wherein said isolator foot portions extend above said flexible circuitry second conductive portions and serve to structurally isolate said flexible circuitry second conductive portions from said connector base.

11. The connector as claimed in claim 1, wherein said connector base is die-cast from a metal and said brace is formed from an electrically non-conductive material.

12. A circuit card connector for providing an electrical connection between a plurality of contacts disposed on a circuit board and a plurality of contacts disposed on a printed circuit card, the circuit card having an edge that is insertable into and removable from said connector, said connector comprising:
   a connector body; the connector body having a connector base for mounting upon the circuit board, said connector body having a circuit card-receiving slot defined therein; flexible circuitry disposed on said connector body on opposing sides of said card-receiving slot, said flexible circuitry having first ends that extend within said card-receiving slot and which contain thereon first conductive portions for contacting said circuit card contacts, said flexible circuitry having second ends that extend beneath said connector body and which contain thereon second conductive portions that are soldered to said circuit board contacts when said connector body is mounted to said circuit board; and, an isolation assembly interposed between said connector body and said flexible circuitry second ends to isolate said flexible circuitry second portions from forces that occur in said connector body which are generated in response to insertion and removal of said circuit card into and from said connector card-receiving slot.

13. The connector of claim 12, wherein said isolation assembly includes a pair of elongated brace members that extend along said connector body and are disposed on opposite sides of a centerline of said connector body.

14. The connector of claim 13, wherein said brace members include foot portions that extend from said connector body toward said flexible circuitry second ends and over said flexible circuitry second conductive portions.

15. The connector of claim 14, wherein said brace members are formed from a thermally insulative material in order to prevent substantial heat transfer from said flexible circuitry second conductive portions to said connector body during soldering thereof to said circuit board.

16. The connector of claim 13, wherein said brace members are formed from a non-metallic, compliant material.

17. The connector of claim 13, wherein said brace members are formed from a material different than that of said connector body.

18. The connector of claim 13, wherein said connector body has a plurality of recesses formed therein along a bottom surface thereof, and said brace members include a plurality of engagement tabs that are received within said connector body recesses.

19. The connector of claim 18, wherein said brace members are heat-staked to said connector body.

20. The connector of claim 12, wherein said isolator assembly includes an attachment surface disposed proximate to said connector body and said flexible circuitry second ends, said flexible circuitry being attached to said isolation assembly attachment surface.

21. The connector of claim 20, wherein said flexible circuitry is adhesively attached to said isolation assembly attachment surface.

22. The connector of claim 13, wherein said connector body includes an elongated connector base extending between two connector end portions, said connector base including a plurality of recesses and each of said brace members includes a plurality of tabs extending therefrom, said brace member tabs being received within said brace member recesses.

23. A connector housing for an electrical connector of the type that provides a connection between a circuit-card and circuit board by way of flexible circuitry, the flexible circuitry having a plurality of first conductive portions adapted to contact corresponding contacts on said circuit card when said circuit card is inserted into said connector and said flexible circuitry having second conductive portions that extend beneath said connector and are adapted for soldering to corresponding contacts positioned on a mounting surface of said circuit board, the connector housing comprising:
   two connector body end portions, each connector body end portion having a slot disposed therein, said connector body end portion slots cooperatively defining a card-receiving slot for receiving an edge of said circuit card therein, an elongated connector base extending between said connector body end portions, the connector base having a first surface for supporting a circuit card engagement assembly and a second surface that opposes the circuit board mounting surface, said connector housing further including an isolation layer disposed along said base second surface in confronting relation to said circuit board mounting surface, the isolation layer being formed from a material different than that of said connector base, said isolation layer engaging said flexible circuitry proximate to said second conductive portions thereof and further having foot portions that extend outwardly with respect to said connector base, the isolation layer foot portions being interposed between said flexible circuitry second conductive portions and said circuit board mounting surface.

24. The connector base assembly as defined in claim 23, wherein said isolation layer includes a pair of elongated brace members formed from a material different than that of said connector base.

25. The connector base assembly as defined in claim 24, wherein said connector base is formed from a metallic material and said isolation layer is formed from a non-metallic material.

26. The connector base assembly as defined in claim 24, wherein said connector has includes a plurality of recesses formed in second surface thereof and said isolation layer brace members include a plurality of engagement tabs that are received within said connector base recesses.

27. The connector base assembly as defined in claim 26, wherein said isolation layer is attached to said connector base by heat-staking said engagement tabs to said connector base.

* * * * *